(12) United States Patent
Sakuyama et al.

(10) Patent No.: US 6,461,953 B1
(45) Date of Patent: Oct. 8, 2002

(54) SOLDER BUMP FORMING METHOD, ELECTRONIC COMPONENT MOUNTING METHOD, AND ELECTRONIC COMPONENT MOUNTING STRUCTURE

(75) Inventors: Seiki Sakuyama; Hiroki Uchida, both of Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/762,478

(22) PCT Filed: Aug. 6, 1999

(86) PCT No.: PCT/JP99/04293

§ 371 (c)(1),
(2), (4) Date: Feb. 7, 2001

(87) PCT Pub. No.: WO00/10369

PCT Pub. Date: Feb. 24, 2000

(30) Foreign Application Priority Data

Aug. 10, 1998 (JP) .......................................... 10-225092

(51) Int. Cl.$^7$ ............................................. H01L 21/44

(52) U.S. Cl. ........................................ 438/612; 438/106

(58) Field of Search ........................... 438/51, 64, 106, 438/118, 122, 463, 611, 612, 691, 940

(56) References Cited

U.S. PATENT DOCUMENTS

| | | | |
|---|---|---|---|
| 4,273,859 A | | 6/1981 | Mones et al. |
| 5,246,880 A | * | 9/1993 | Reele et al. ................ 438/612 |
| 5,316,788 A | * | 5/1994 | Dibble ........................ 427/98 |
| 5,462,638 A | | 10/1995 | Datta et al. |
| 5,539,153 A | * | 7/1996 | Shwiebert et al. .......... 174/260 |
| 5,803,340 A | | 9/1998 | Yeh et al. |
| 6,159,770 A | * | 12/2000 | Kawahara et al. .......... 438/112 |

FOREIGN PATENT DOCUMENTS

| | | |
|---|---|---|
| EP | 0 655 779 A1 | 5/1995 |
| JP | 56-49543 | 5/1981 |
| JP | 57-10998 | 1/1982 |
| JP | 58-103198 | 6/1983 |
| JP | 61-251152 | 11/1986 |
| JP | 61-296728 | 12/1986 |
| JP | 61-296729 | 12/1986 |
| JP | 62-234352 | 10/1987 |
| JP | 62-266851 | 11/1987 |
| JP | 63-29552 | 2/1988 |
| JP | 63-31138 | 2/1988 |
| JP | 63-81951 | 4/1988 |
| JP | 63-119550 | 5/1988 |
| JP | 1-129549 | 5/1989 |
| JP | 1-161850 | 6/1989 |
| JP | 1-264245 | 10/1989 |
| JP | 2-25236 | 2/1990 |
| JP | 2-90529 | 3/1990 |
| JP | 2-284426 | 11/1990 |
| JP | 3-22437 | 1/1991 |

(List continued on next page.)

OTHER PUBLICATIONS

762 Research Disclosure—Oct. 1991.

*Primary Examiner*—David Nelms
*Assistant Examiner*—David Nhu
(74) *Attorney, Agent, or Firm*—Armstrong, Westerman & Hattori, LLP (57) ABSTRACT

A solder bump forming method includes the steps of packing solder (5) into a plurality of recesses (11) provided to the surface layer (12) of a substrate (1); and melting/hardening the solder to form solder bumps (5A) within the recesses (11). The solder bump forming method further includes, prior to the step of packing solder (5) into the plurality of recesses (11), a step of adhering or arranging a film (4) over the surface layer (12), and a step of producing in the film (4) a plurality of window portions (40) communicating with the plurality of recesses. The film (4) is composed of a material principal component of which is different from the material of the substrate (1).

11 Claims, 8 Drawing Sheets

FOREIGN PATENT DOCUMENTS

| | | |
|---|---|---|
| JP | 4-127436 | 4/1992 |
| JP | 4-208532 | 7/1992 |
| JP | 5-206209 | 8/1993 |
| JP | 6-112208 | 4/1994 |
| JP | 6-267964 | 9/1994 |
| JP | 7-273439 | 10/1995 |
| JP | 7-321113 | 12/1995 |
| JP | 8-172259 | 7/1996 |
| JP | 8-186361 | 7/1996 |
| JP | 9-116257 | 5/1997 |

* cited by examiner

SOLDER BUMP FORMING METHOD, ELECTRONIC COMPONENT MOUNTING METHOD, AND ELECTRONIC COMPONENT MOUNTING STRUCTURE

TECHNICAL FIELD

The present invention relates to a solder bump forming method for forming solder bumps on substrates of various kinds, to an electronic component mounting method, and to an electronic component mounting structure.

As used herein, the term "substrate" is not limited to the narrow definition of printed circuit boards, wafers, and the like, but is defined broadly to include all manner of materials permitting formation of solder bumps thereon.

BACKGROUND ART

Demand for ever higher electronic component mounting densities in recent years has led to a switch in electronic component mounting processes from face-up techniques employing wire bonding to face-down techniques using solder bumps. Typical conventional methods for solder bump formation include plating processes and vapor deposition processes. Such methods, however, have the drawback of requiring large and expensive equipment, and do not allow for easy control of solder bump height and solder composition.

Past proposals for solving this problem include the use of heat-resistant insulating film (JP-A-1-161850) and the use of sheets (JP-A-9-116257).

Figure 9A:
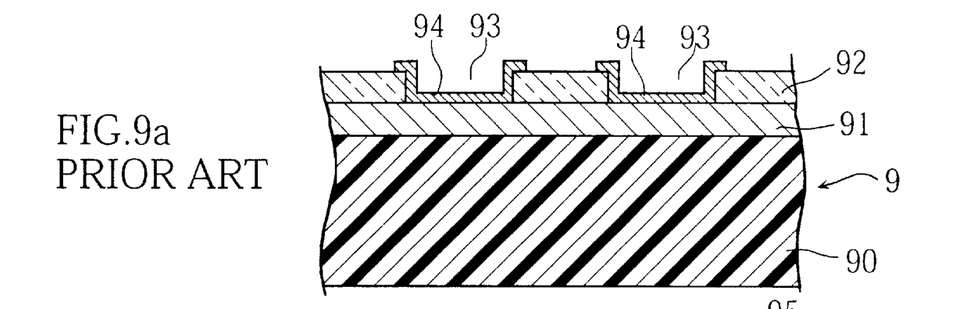
FIGS. 9a–9d are fragmentary sectional views illustrating an exemplary conventional solder bump forming method.
Figure 9B:
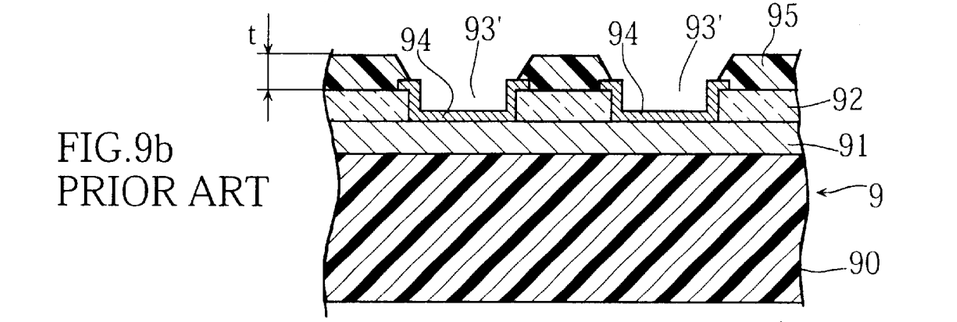
Figure 9C:
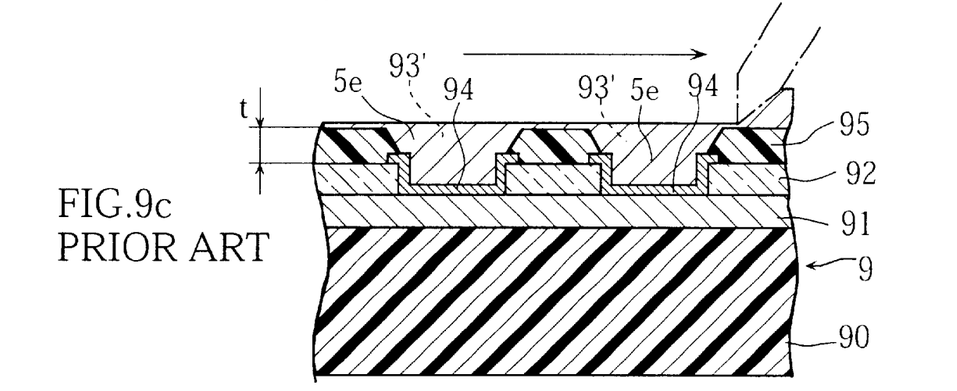
Figure 9D:
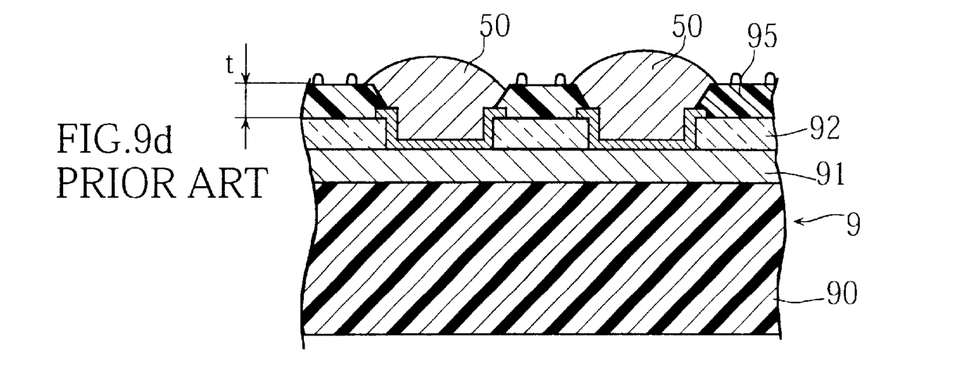

Referring to accompanying FIG. 9a, according to the solder bump forming method of JP-A-1-161850, a board 9 on which solder bumps are to be formed has as structure wherein a glass film surface layer 92 has been formed covering the aluminum metallization 91 on the surface of the board proper 90, and electrodes 94 have been situated within recesses 93 provided in this surface layer 92. To form solder bumps on board 9, first, an insulating film 95 is formed over surface layer 92 as shown in FIG. 9b. This insulating film 95 is formed by applying a liquid resin over the entire surface of surface layer 92 and electrodes 94 and then etching the resin from the surfaces of the electrodes 94. By this process recesses 93' that are deeper than recesses 93 are formed above electrodes 94. Recesses 93' are then filled with solder paste 5e as shown in FIG. 9c, and the solder is then heated to re-melt it, and then hardened. With this method, the depthwise dimension of recesses 93' is increased by formation of a dielectric layer 95 over surface layer 92 allowing the amount of solder paste packed into recesses 93' to be increased. As a result, it is possible to produce protruding solder bumps 50, as shown in FIG. 9d.

However, the method depicted in FIGS. 9a–9d has a number of drawbacks, such as the following. Since dielectric layer 95 is formed over surface layer 92 by a process of applying a liquid resin over the entire surface of surface layer 92 and electrodes 94 and then etching portions thereof, it is difficult to accurately produce a finished dielectric layer 95 having predetermined thickness t throughout. It is accordingly a difficult matter to ensure that the plurality of recesses 93' have uniform depth at all locations, and this tends to result in significant variation in height of the plurality of solder bumps 50 formed subsequently. Height variation of solder bumps 50 is undesirable in terms of achieving electrical interconnection with other components via the solder bumps.

Where solder bumps are utilized for electrical interconnection with other components, it is sometimes necessary to use large amounts of solder in order to make the solder bumps as tall as possible. With the conventional method described above, however, there exists a certain limit as to the thickness t of the insulating film 95 that can formed by application of liquid resin, and this in turn prevents recesses 93' from being made very deep. It is accordingly difficult to form solder bumps 50 of height exceeding a certain given height. A further drawback of the conventional method is that if is attempted to increase total insulating film thickness by forming an additional insulating film layer over insulating film 95 in the same manner, the liquid resin becomes thickly applied in recesses 93' as well during application of the resin to produce the dielectric layer, and it is difficult to properly etch the resin in these areas.

Figure 10A:
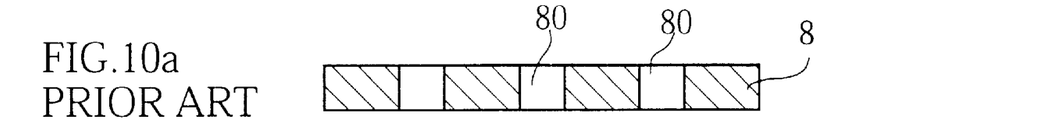
FIGS. 10a–10f are sectional views illustrating another exemplary conventional method.
Figure 10B:
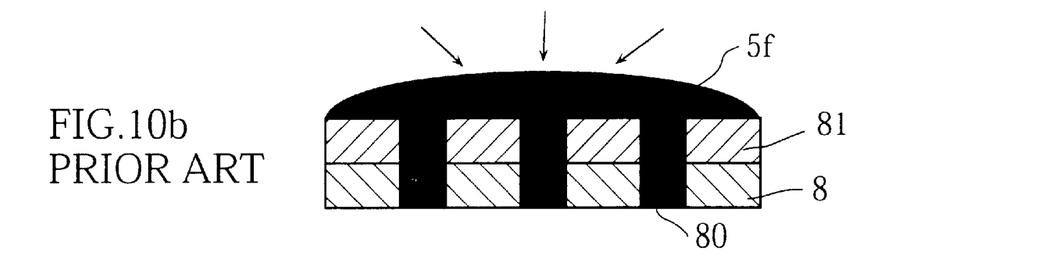
Figure 10C:
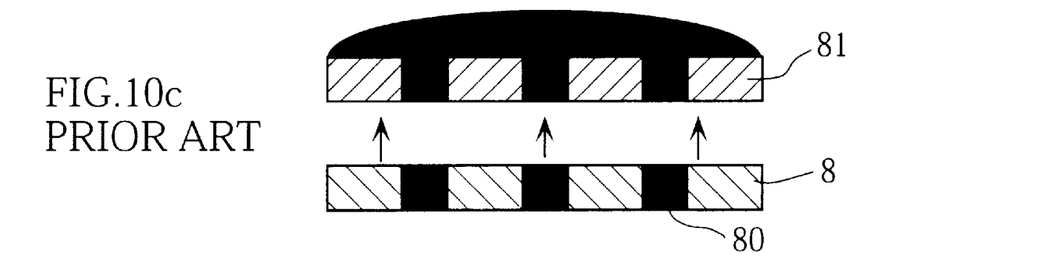
Figure 10D:
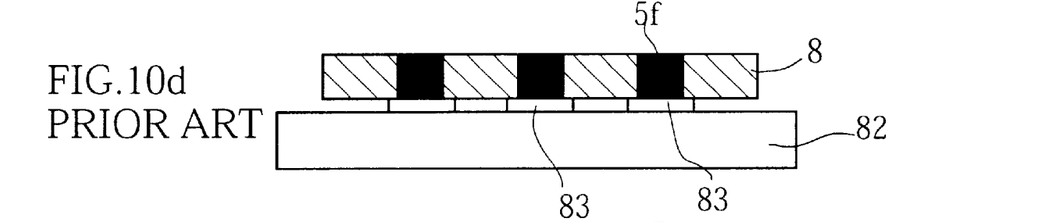
Figure 10E:
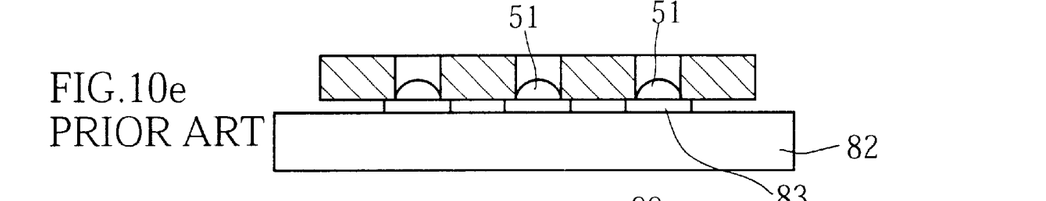
Figure 10F:
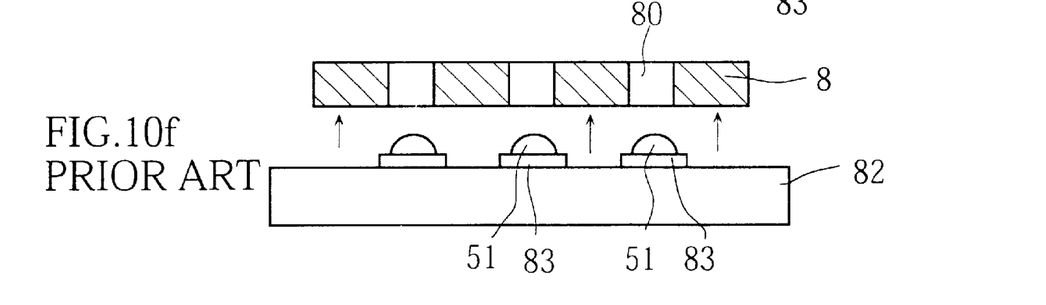

The solder bump forming method disclosed in JP-A-9-116257, on the other hand, employs a sheet 8 having openings 80 therein, as shown in FIG. 10a. To form solder bumps, a mask sheet 81 is first superposed on sheet 8 as shown in FIG. 10b, using the mask sheet 81 to pack solder paste 5f into the openings 80 of sheet 8. The mask sheet 81 is then separated from sheet 8 as shown in FIG. 10c. Next, as shown in FIG. 10d, sheet 8 is arranged on a substrate 82 with solder paste 5f situated over electrodes 83. Heating and re-melting solder paste 5f in this state produces solder bumps 51 as shown in FIG. 10d. Sheet 8 is subsequently removed from substrate 82 as shown in FIG. 10f. This method allows sheet 8 to be reused in a plurality of solder bump forming operations, and additionally allows depth and diameter of openings 80 of sheet 8 to be made uniform throughout.

However, the conventional method depicted in FIGS. 10a–10f requires prefabrication of a sheet 8 having a plurality of openings 80 corresponding in arrangement to the arrangement of the plurality of electrodes 83 on substrate 82. Further, fabrication of sheet 8 requires an operation totally separate from the process for forming electrodes 83 on substrate 82. Thus, in addition to the labor entailed in fabricating sheet 8, fabrication of sheet 8 becomes increasingly difficult at the smaller pitch of the plurality of electrodes 83 needed for smaller integrated circuit patterns. Smaller pitch of the plurality of electrodes 83 also results in reduced precision of alignment of the plurality of electrodes 83 and the plurality of openings 80 in sheet 8. As a result, this latter method has the drawback of difficulty in precisely aligning solder paste 5f over electrodes 83 at smaller pitches of the plurality of electrodes 83, and poses the risk of unwanted conduction between adjacent solder bumps 51, 51.

JP-A-7-273439 discloses a solder bump forming method whereby the drawbacks of the two preceding conventional methods may be overcome. The solder bump forming method disclosed in this publication involves first forming a first solder resist layer on the surface of a board having a circuit pattern formed thereon, and then etching this first solder resist layer to produce openings in locations corresponding to the locations of electrodes in the circuit pattern. A second solder resist layer is then applied to the surface of the first solder resist layer, and this second solder resist layer is etched to produce openings in locations corresponding to the openings in the first solder resist layer. The openings in the two solder resist layers are then filled with solder paste, which is heated/re-melted and then hardened to produce solder bumps on the electrodes in the circuit pattern. Finally, the second solder resist layer is dissolved away using a dissolving liquid that dissolves the second solder resist layer without dissolving the first solder resist layer.

With this method, the thickness of the first solder resist layer and the thickness of the second solder resist layer are utilized to create greater depth in the recesses (the openings formed by the two solder resist layers) into which the solder paste is packed, thus allowing solder bumps of sufficient size to be formed. Since the first solder resist layer remains after the second solder resist layer has been dissolved away, shorting between solder bumps is prevented, so the process is adaptable to finer pitch between electrodes.

According to the method disclosed in JP-A-7-273439, however, if the board and the second solder resist layer are based on the same type of resin, the board will partially dissolve during the process of dissolving the second solder resist layer, resulting in defects. Further, the need for a process to dissolve away the second solder resist layer cannot be said to represent process efficiency. It is further necessary to align the solder bumps on the electronic component with the solder bumps on the board during bonding of electronic components, and product reliability may suffer if alignment defects should occur.

DISCLOSURE OF THE INVENTION

With the foregoing in view, it is an object of the invention to provide a solder bump forming process affording precise formation of a plurality of solder bumps of predetermined height by means of a simple procedure, while avoiding unwanted dissolution of the substrate, even if the substrate should comprise a resin.

It is a further object of the invention to provide a method and structure whereby electronic components may be mounted on a substrate in an efficient manner without the need for a process to dissolve away the resin layer used to form the solder bumps.

In a first aspect the invention provides a solder bump forming method comprising the steps of: packing solder into a plurality of recesses provided to the surface layer of a substrate; and melting/hardening the solder to form solder bumps within said recesses, said method having the steps of: in a step coming prior to packing solder into said plurality of recesses, adhering or arranging a film over said surface layer; and producing in said film a plurality of window portions communicating with said plurality of recesses; wherein said film is composed of a material based on a component different than the material of which said substrate is composed.

According to this first aspect of the invention, in a step coming prior to packing solder into the plurality of recesses in the surface layer of a substrate, a film is adhered or arranged over the surface layer and a plurality of window portions communicating with the plurality of recesses are formed in the film, whereby the plurality of window portions provided in the film may also be filled with solder when packing solder into the plurality of recesses in the film. It is accordingly possible to increase the height of solder positioned over the electrodes on the substrate so as to afford proper formation of protruding solder bumps through hardening of the solder subsequent to melting thereof. Where a film of uniform thickness throughout is employed, the plurality of window portions provided in the film will of necessity be uniform throughout as well, whereby solder positioned over the electrodes on the substrate may be imparted with uniform given height. It is accordingly possible to avoid significant variation in the height dimension among the plurality of solder bumps. Solder bump height herein corresponds in dimension to the thickness of the film, and it is therefore a simple matter to set solder bumps to predetermined height. Solder bump height may be increased further by either using a thicker film, or stacking a plurality of films.

Further, since the material of the film is different from the material of the substrate, unwanted penetration into the substrate when the film is dissolved away with a dissolving liquid is avoided. From this standpoint, where the substrate consists, for example, of epoxy resin, the film may be composed of an acrylic or imide resin. By simply placing (instead of adhering) the film on the substrate surface layer, the film may be easily stripped away once the solder bumps have been formed, reducing the likelihood of connection defects due to film residue adhering to electrodes.

In preferred embodiment, the substrate surface layer comprises a resist layer located on the surface of the substrate proper, and this resist layer is exposed and developed to produce openings located above the electrodes.

In preferred embodiment, the film is photosensitive, and the step of forming a plurality of window portions in the film is a step of exposing and developing the film. Alternatively, the step of forming a plurality of window portions in the film is a step of irradiating the film with a laser.

In preferred embodiment, the process of packing solder into recesses in the substrate surface layer with will be carried out by packing solder paste, solder powder, or molten solder therein through the window portions in the film. Where molten solder is used for filling, the substrate may be immersed in a molten solder bath under normal or reduced pressure after window portions have been formed in the film.

In a second aspect the invention provides an electronic component mounting method for mounting electronic components on a substrate having a surface layer with a plurality of recesses formed therein, and connecting via solder the electrodes of these electronic components with electrodes situated within the recesses, said method comprising the steps of: in a step coming prior to mounting electronic components on said substrate, adhering or arranging a film over the surface layer; producing in said film a plurality of window portions communicating with said plurality of recesses; and packing solder into said plurality of window portions and said plurality of recesses; wherein said solder is melted subsequent to mounting electronic components on said substrate.

According to the mounting method herein, electronic components are already mounted on the substrate when the solder arranged over the electrodes is melted, so when the solder is melted, the solder affords mechanical and electrical connection between electrodes of electronic components and electrodes on the substrate. Thus the need to form solder bumps independently on the substrate or to remove the film is obviated, allowing electronic components to be mounted on substrates with fewer process steps. This increases the efficiency of electronic component mounting operations. Additionally, since the window portions of the film can be utilized for positioning solder bumps on the electronic components, alignment is easier than with bump-to-bump alignment, improving reliability.

The process steps of the electronic component mounting method provided by a second aspect of the invention up through the step of packing solder into the plurality of recesses formed in the surface layer of the substrate are the same as the process steps of the solder bump forming method provided by a second aspect of the invention, and the advantages thereof are therefore similar to those afforded by the first aspect of the invention described earlier. That is, according to the electronic component mounting method provided by a second aspect of the invention, a plurality of window portions in the film applied to or arranged on the surface layer of the substrate can be controlled to uniform depth throughout, whereby the amount of solder connecting a plurality of electrodes on the substrate to electronic components can be made uniform throughout. Additionally, it is a simple matter to increase the amount of solder connecting a plurality of electrodes on the substrate to electronic components by increasing film thickness, for example. It is accordingly possible to mount electronic components on a substrate without incurring excessive or insufficient quantities of solder. The simplicity and accuracy of the procedure of providing a film with a plurality of window portions corresponding to a plurality of electrodes on a substrate also makes the process adaptable to finer pitch of a plurality of electrodes.

In a third aspect the invention provides an electronic component mounting structure wherein electronic components are mounted on a substrate having a surface layer with a plurality of recesses formed therein, these electronic components being connected by means of solder to electrodes situated with the recesses on said substrate, wherein a film having a plurality of window portions communicating with said recess is formed on said surface layer.

This third aspect of the invention represents a mounting structure realized through the mounting method of the second aspect described above, and as such affords the same advantages as the second aspect.

These and other features and advantages of the invention will be apparent from the following description of the embodiments.

BRIEF DESCRIPTION OF THE DRAWINGS

FIGS. 2a–2c are fragmentary sectional views illustrating the production process for the circuit board of FIG. 1a;

BEST MODE FOR CARRYING OUT THE INVENTION

The preferred embodiments of the invention are described in detail hereinbelow with reference to the accompanying drawings.

FIGS. 1a–1f are fragmentary sectional views illustrating an exemplary solder bump forming method of the invention. FIGS. 2a–2c are fragmentary sectional views illustrating the production process for the circuit board of FIG. 1a.

Figure 1A:
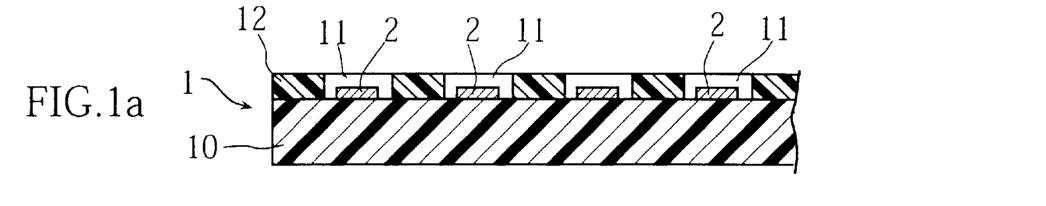
FIGS. 1a–1f are fragmentary sectional views illustrating an exemplary solder bump forming method of the invention.
Figure 2A:
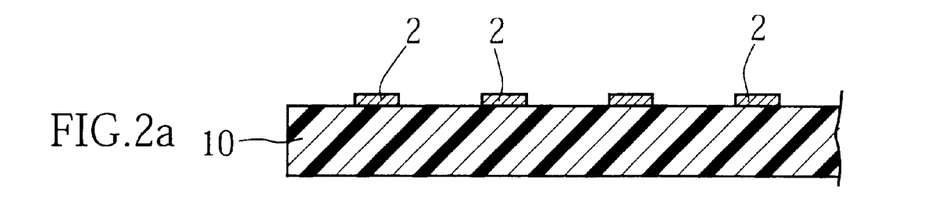
Figure 2B:
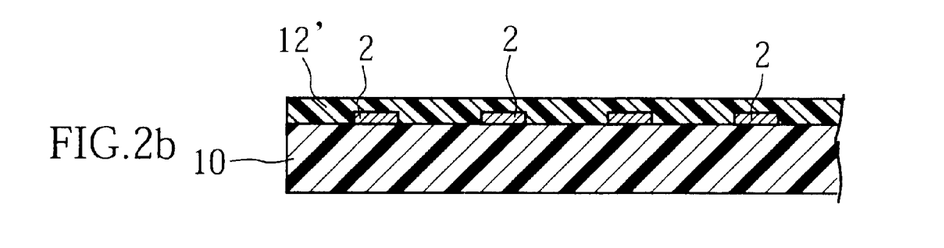
Figure 2C:
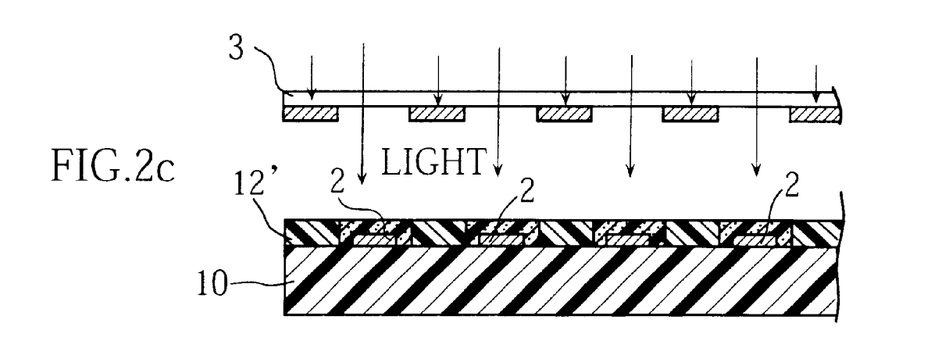

The circuit board 1 depicted in FIG. 1(a) is provided with a surface layer 12 of given thickness and having formed therein a plurality of recesses 11 on the surface of the board proper 10. An electrode 2, fabricated of copper for example, is provided within each of the recesses 11. The board proper 10 is fabricated of glass fiber (or glass cloth) reinforced epoxy resin, for example.

Circuit board 1 has the initial structure depicted in FIG. 2a, wherein the surface of the board proper 10 has formed thereon a plurality of electrodes 2 and leads (not shown) electrically continuous therewith. The procedure for forming a surface layer 12 on board proper 10 involves first forming a photoresist layer 12' thicker than the electrodes 2 on the surface of board proper 10, as shown in FIG. 2b. Next, as shown in FIG. 2c, photoresist layer 12' is exposed through a photomask 3 and then developed. Where photoresist layer 12' is a positive resist, for example, photoresist layer 12' may be exposed at locations thereof where the electrodes 2 are formed and the surrounding areas, and then developed to remove the photoresist from over the electrodes 2 and the surrounding areas. This series of steps affords a structure like that depicted in FIG. 1a, wherein the surface of board proper 10 is provided with a surface layer 12 comprising a photoresist layer. The solder bump forming operation described hereinbelow may be carried out subsequent to this operation for providing the surface layer 12.

Figure 1B:
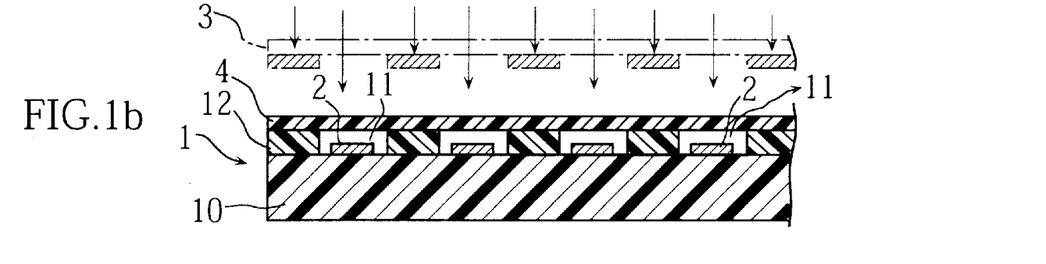

The procedure for forming solder bumps on the circuit board 1 shown in FIG. 1a involves first adhering or arranging a film 4 having given thickness over the surface of surface layer 12, as shown in FIG. 1b. Where circuit board 1 is composed of glass fiber reinforced epoxy resin, the film 4 may be composed of a photosensitive material such as an acrylic resin or imide resin so as to avoid penetration into circuit board 1 when the film 4 is subsequently dissolved away with a dissolving liquid. The top openings of the recesses 11 in surface layer 12 are blocked by application or arrangement of this film 4.

Figure 1C:
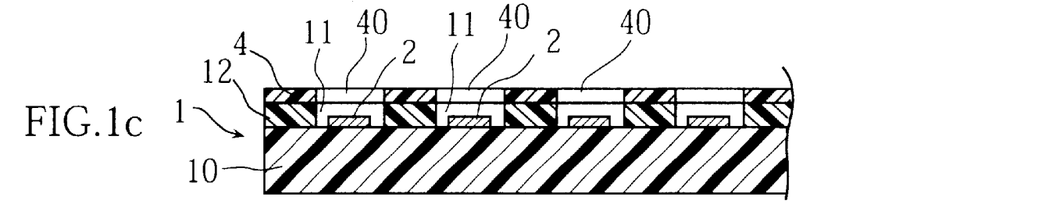

Next, as shown in FIG. 1c, film 4 is provided with a plurality of window portions 40 communicating with the plurality of recesses 11. Window portion 40 diameter is the same as or similar to that of the recesses 11. The procedure for providing film 4 with window portions 40 may be conducted using a technique similar to that use to form the recesses 11 in the photoresist layer 12' described earlier, and then removing portions of the film 4 situated above the recesses 11. For example, where photoresist layer 12' is a positive resist, using a film 4 having similar positive photosensitivity allows the photomask 3 used for exposing the photoresist layer 12' to be used for exposing the film 4 as well, as shown by the hypothetical lines in FIG. 1b. A resultant advantage is that photomask 3 can be used for both processes. Another advantage of using the same photomask for forming recesses 11 and window portions 40 is that recesses 11 and window portions 40 will be precisely aligned.

Figure 1D:
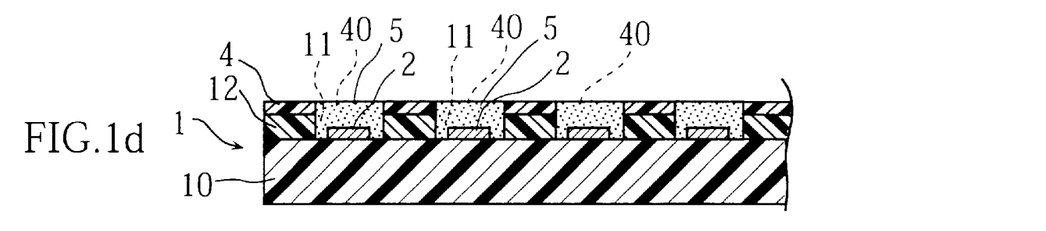

Once window portions 40 have been formed, window portions 40 and the recesses 11 situated therebelow are packed with solder paste 5, as shown in FIG. 1d. When packing in the solder paste 5 it is desirable to avoid large amounts of excess solder paste remaining on the top surface of film 4; this may be accomplished inter alia by scraping off excess solder paste from the top surface of film 4 using a squeegee. In the present embodiment, the window portions 40 may be filled with solder powder instead of solder paste 5.

Figure 1E:
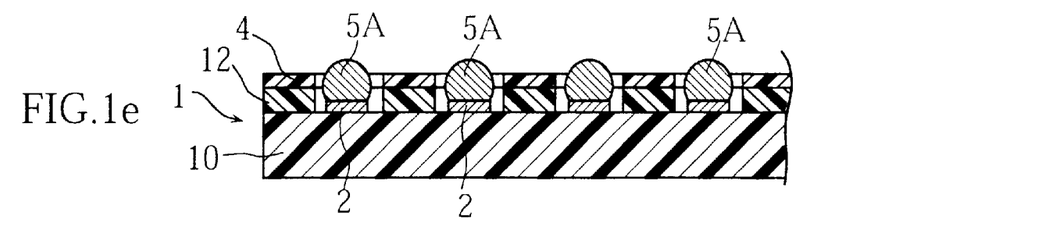

The solder paste 5 is then heated and re-melted, whereby non-solder ingredients contained in the solder paste 5 are volatilized out, and the solder component assumes a shape approximating a ball due to its surface tension, as shown in FIG. 1e, into which shape it subsequently hardens with natural cooling. As a result, a plurality of solder bumps 5A bonded to electrodes 2 are formed. Since the solder bumps 5A are formed of solder paste 5 which has been packed into window portions 40 as well as into recesses 11, they can be made quite tall. Additionally, since window portions 40 are of uniform depth throughout, variation in height among solder bumps 5A can be avoided.

Figure 1F:
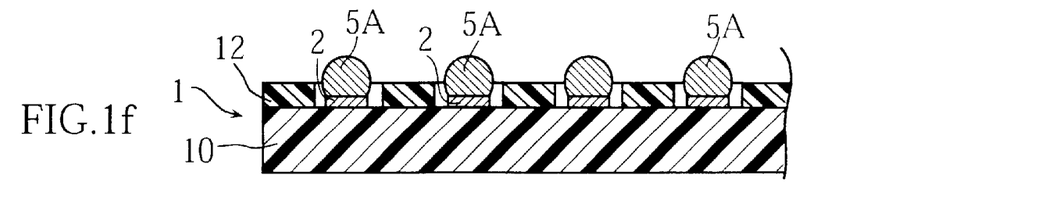

After the solder bumps 5A have been formed, the film 4 is removed from the surface layer 12 as shown in FIG. 1f. The film 4 may be removed by peeling off the film 4 of by dissolving away the film 4 with a suitable solvent. Where the film 4 has simply been arranged on the surface layer 12 of circuit board 1 (as opposed to being adhered thereto), the film 4 may be peeled away easily. In some cases, however, it may be permissible to leave the film 4 adhered to the surface layer 12. If film 4 is an electrically insulating material, electrical interconnection via solder bumps 5A will not be hindered even if the film 4 is left adhered to the surface layer 12.

Figure 3:
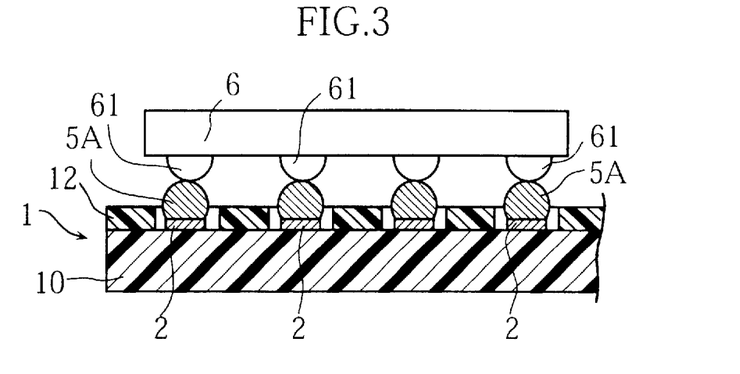
FIG. 3 is a fragmentary sectional view illustrating an exemplary method for mounting an electronic component on a substrate having solder bumps formed thereon by the method depicted in FIGS. 1a–1f.
Figure 4:
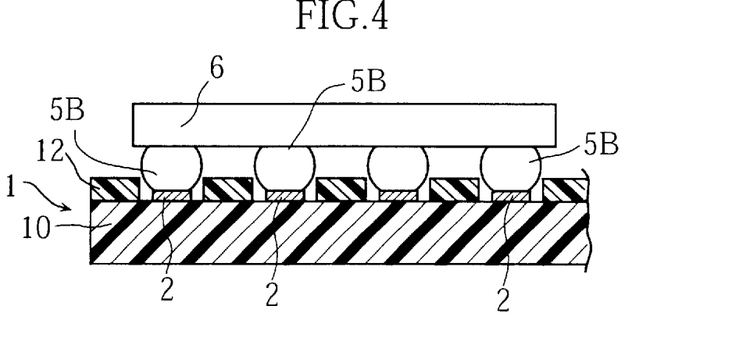
FIG. 4 is a fragmentary sectional view illustrating an electronic component mounting structure achieved with the mounting method illustrated in FIG. 3.

The circuit board 1 fabricated by the preceding series of steps may be employed in flip-chip joining of electronic components. Referring to FIG. 3, to mount a semiconductor chip 6 on circuit board 1, first the semiconductor chip 6 is set on the circuit board 1 so that the bump electrodes 61 on semiconductor chip 6 are situated in opposing contact with the plurality of solder bumps 5A. The bump electrodes 61 of semiconductor chip 6 are for example solder bump electrodes. and the solder bump forming method herein may be employed in forming these bump electrodes 61 as well. When the plurality of solder bumps 5A and bump electrodes 61 are heated and melted, the solder, of which the solder bumps 5A and bump electrodes 61 are composed, fuses into unitary bumps 5B, as shown in FIG. 4, whereby the electrodes 2 of circuit board 1 are connected with the electrodes of semiconductor chip 6 via these bumps 5B.

When performing the semiconductor chip 6 mounting operation, preferred practice is to pre-apply a flux to the distal ends of the solder bumps 5A in order to improve "wetability." An exemplary flux is a rosin based product containing a solvent (e.g. ethanol) and actives such as organic acids or organohalogens. By applying a contact adhesive to the distal ends of solder bumps 5A in lieu of applying flux or in addition to applying flux, the solder bumps 5A and bump electrodes 61 can be maintained positioned properly utilizing the contact adhesion of the contact adhesive. Rosin, for example, would be suitable as the contact adhesive.

Figure 5A:
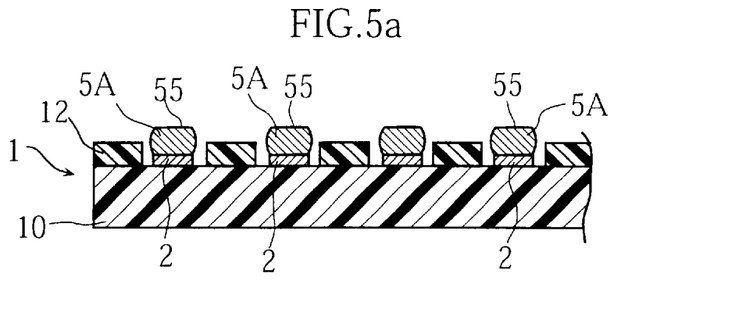
FIGS. 5a and 5b are fragmentary sectional views illustrating another exemplary method for mounting electronic components on a substrate having solder bumps formed thereon by the method depicted in FIGS. 1a–1f.
Figure 5B:
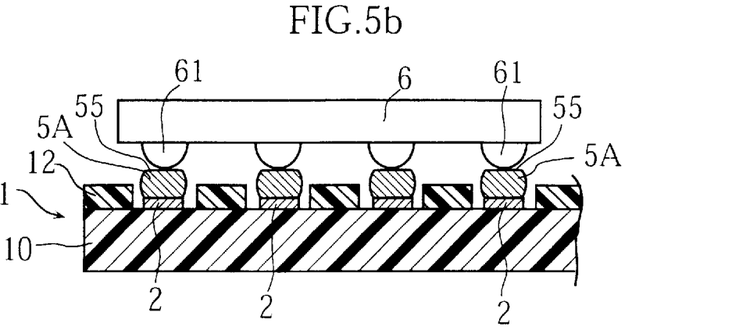

In performing the semiconductor chip 6 mounting operation it is also acceptable to form planar portions 55 on the tops of the solder bumps 5A, as shown in FIG. 5a. These planar portions 55 may be formed by pressing down on the solder bumps 5A from above. The presence of planar portions 55 affords stable arrangement of the bump electrodes 61 of semiconductor chip 6 on the planar portions 55 of solder bumps 5A as shown in FIG. 5b. Where a flux or contact adhesive is being applied, the product may be applied over the planar portions 55, whereby this procedure is facilitated as well.

FIGS. 6a–6e are fragmentary sectional views illustrating another exemplary solder bump forming method of the invention. In FIGS. 6a–6e and subsequent figures identical symbols designate elements similar to those in the preceding embodiment.

Figure 6A:
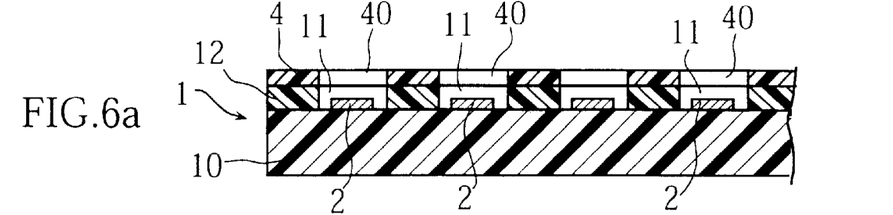
FIGS. 6a–6e are fragmentary sectional views illustrating another exemplary solder bump forming method of the invention.

The method shown in FIGS. 6a–6e involves adhering or arranging two films 4, 4A over the surface layer 12 of a circuit board 1. More specifically, as shown in FIG. 6a, a first film 4 is first adhered or arranged over surface layer 12 of circuit board 1, and this film 4 is then provided with a plurality of window portions 40. The constitution of this circuit board 1 is identical to the constitution depicted in FIG. 1c, and the operation steps up to this point are the same as in the preceding embodiment.

Figure 6B:
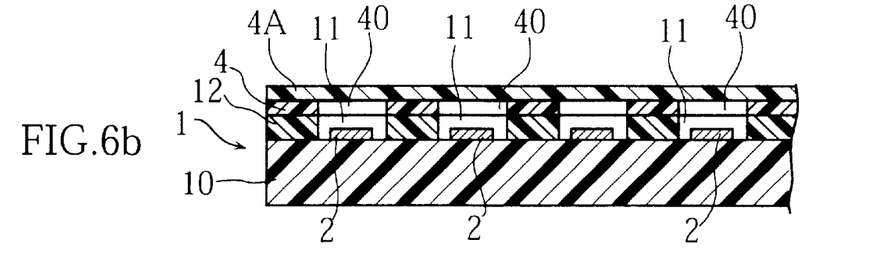

Next, a second film 4A of a similar photosensitive material is adhered or arranged over the surface of film 4, as shown in FIG. 6b.

Figure 6C:
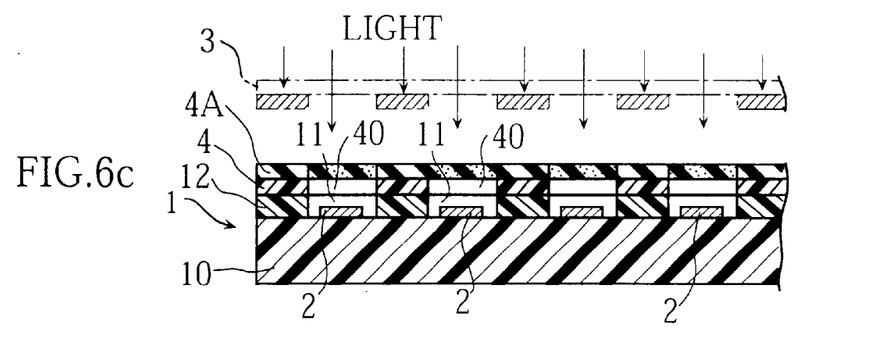
Figure 6D:
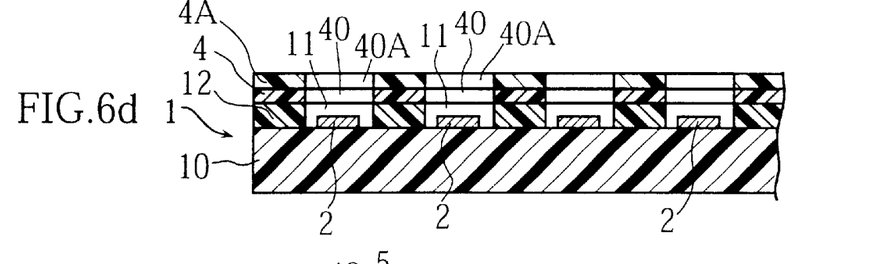

This second film 4A is then exposed and developed as shown in FIG. 6c. As a result, the second film 4A is formed with a plurality of window portions 40A directly above the window portions 40 in an appropriate manner by means of this exposure and developing process, as shown in FIG. 6d.

Figure 6E:
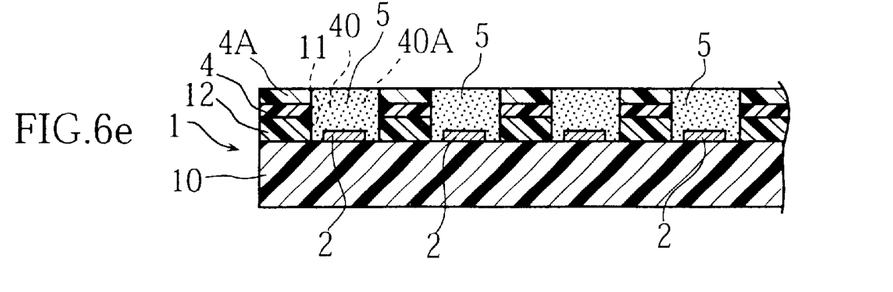

After the window portions 40A have been formed, the window portions 40A, the window portions 40 communicating therewith, and the plurality of recesses 11 are filled with solder paste 5 as shown in FIG. 6e. The solder paste 5 is subsequently heated, re-melted, and then hardened in the same manner as in the step depicted in FIG. 1e. Solder bumps are formed thereby.

According to this method, the amount of solder paste 5 for forming solder bumps can be increased by an amount equivalent to the depth of the window portions 40 formed using the second film 4A, allowing the solder bumps to be made taller. In the present embodiment not just one film, but two films or an even greater number of films may be stacked on the surface layer of a circuit board, providing each of the plurality of films with window portions.

Figure 7:
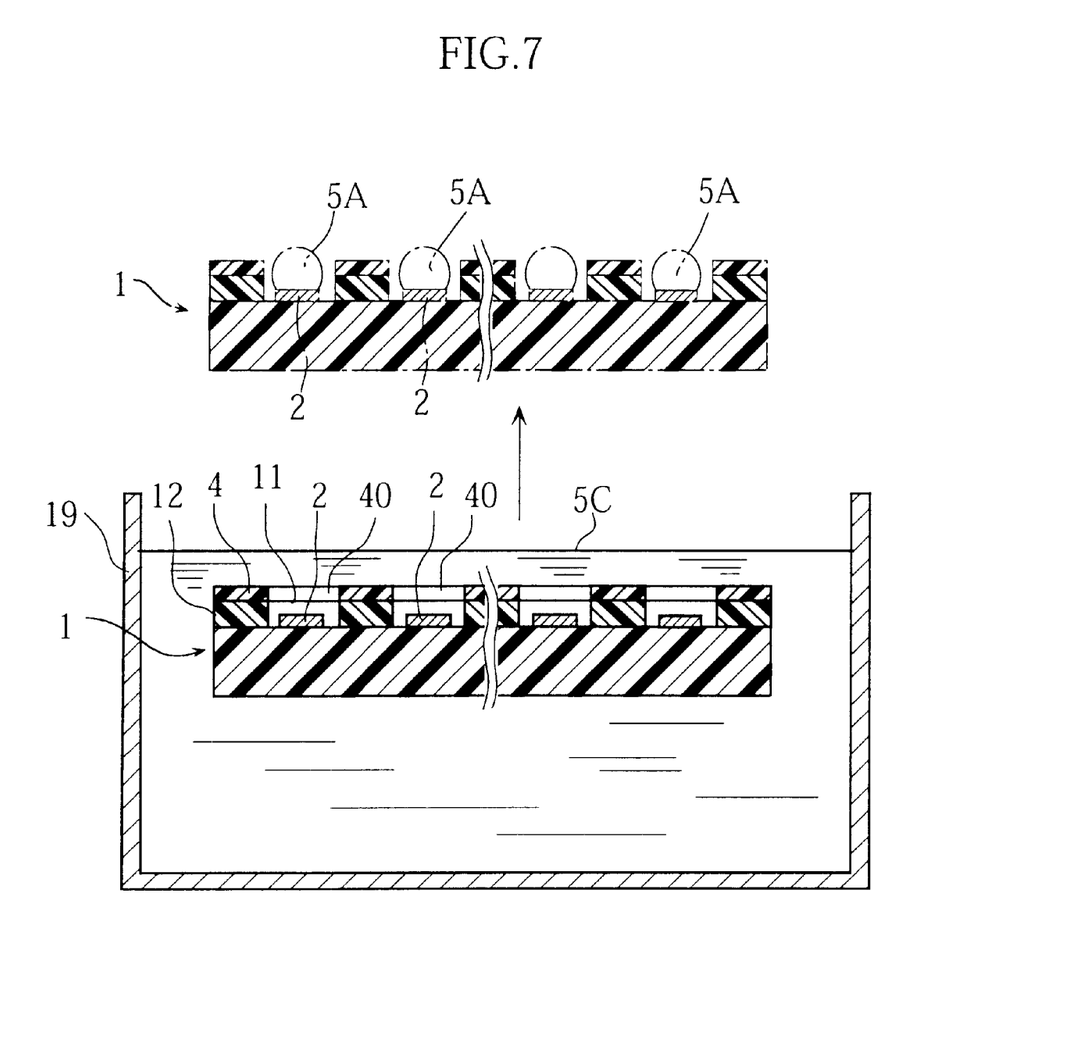
FIG. 7 is a fragmentary sectional view illustrating an exemplary solder packing procedure using molten solder.

FIG. 7 is an illustrative diagram of another exemplary solder packing procedure. The procedure depicted in the figure involves immersing a circuit board 1 in a molten solder bath 5C located inside a solder reservoir 19. A film 4 has been adhered to the surface layer 12 of circuit board 1 and has been provided with a plurality of window portions 40. The constitution thereof is the same as that of the circuit boards depicted in FIGS. 1c and 6a previously. In preferred embodiment, the procedure will be conducted under a partial vacuum in order to reliably flow the molten solder into the tiny window portions 40 of the film 4.

By the procedure depicted in FIG. 7 it is possible to fill the window portions 40 and the recesses 11 in the surface layer 12 with molten solder 5C. When the circuit board 1 is withdrawn from the solder reservoir 19 and allowed to dry naturally, solder bumps 5A will form in the manner indicated by the hypothetical lines in the figure. The present embodiment not only obviates the need to reheat the solder in order to melt it, but also avoids thinning of solder bumps due to volatilization of non-solder ingredients, such as occurs with solder paste. It should however be noted that if the circuit board 1 is not quickly stabilized to the proper attitude after the circuit board 1 has been withdrawn from the solder reservoir 19 there exists a risk that solder bumps 5A will harden while mispositioned with respect to electrodes 2. In such instances, thinning of solder bumps due to volatilization of non-solder ingredients, such as occurs with solder paste is avoided. It should however be noted that if the circuit board 1 is not quickly stabilized to the proper attitude after the circuit board 1 has been withdrawn from the solder reservoir 19 there exists a risk that solder bumps 5A will harden while mispositioned with respect to electrodes 2. In such instances, correction may be performed by stabilizing the circuit board 1 in the horizontal attitude and reheating the solder bumps 5A.

It will therefore be apparent that the solder packing method herein is not limited to the use of solder paste or solder powder, it being possible to fill with molten solder as well. As used herein the term "solder" is not limited to materials based on Sn, Pb, In or the like, and is used to include also those based on Ag or the like for use in joining electronic components.

FIGS. 8a–8f are sectional views illustrating an exemplary electronic component mounting method of the invention. As shown in FIGS. 8a–8d, a film 4 is adhered or arranged on the surface layer 12 of a circuit board, the film 4 is provided with a plurality of window portions 40, and the plurality of window portions 40 and the recesses 11 communicating therewith are then filled with solder paste 5. This series of process steps is analogous to the process steps shown in FIGS. 1a–1d.

Figure 8A:
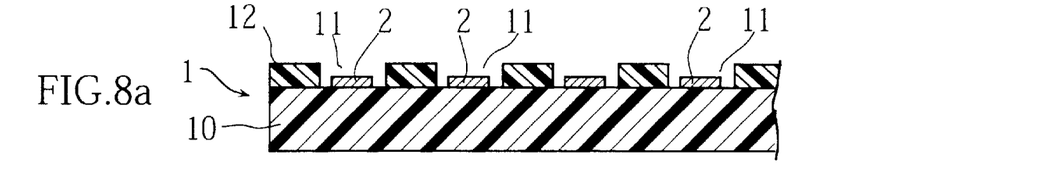
FIGS. 8a–8f are fragmentary sectional views illustrating an exemplary electronic component mounting method of the invention.
Figure 8B:
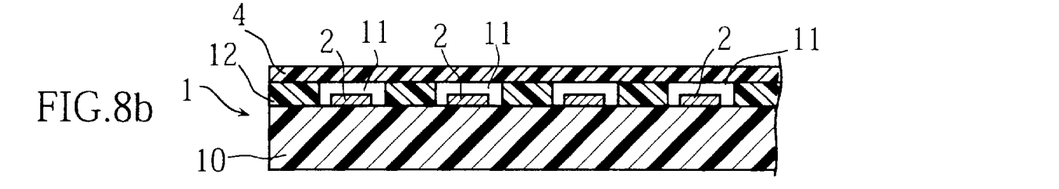
Figure 8C:
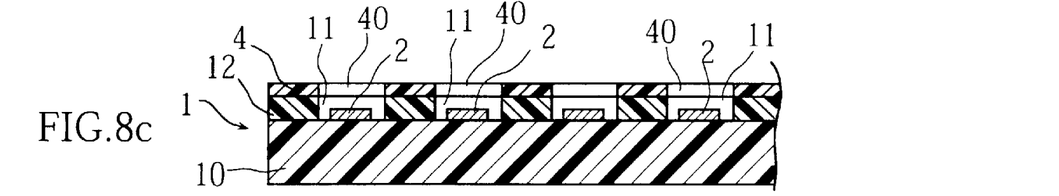
Figure 8D:
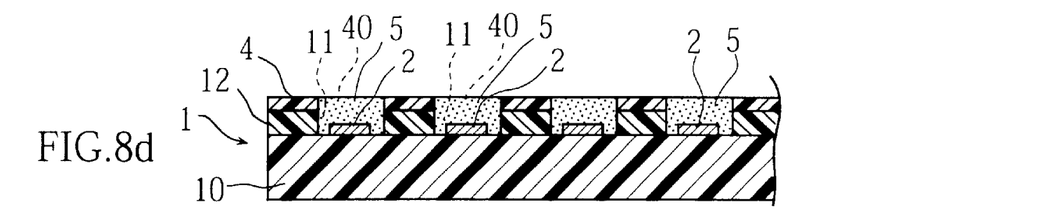
Figure 8E:
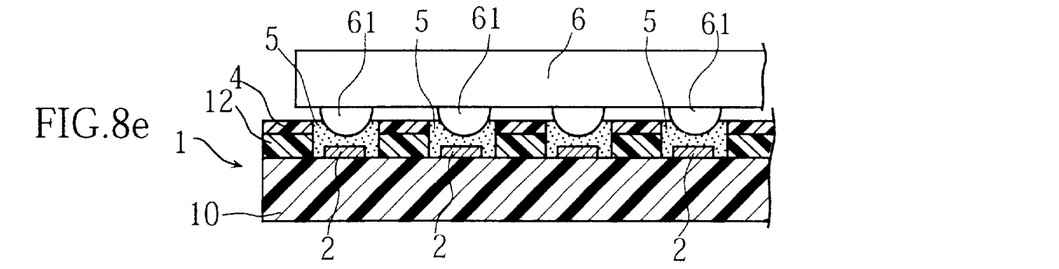

Subsequent to completing packing of the solder paste 5, a semiconductor chip 6 to be mounted is arranged with the bump electrodes 61 thereof contacting the solder paste 5, as shown in FIG. 8e.

Figure 8F:
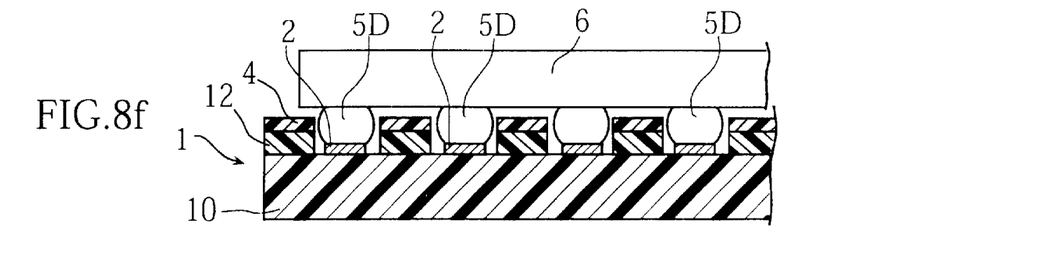

In this state the solder paste 5 is heated, melted, and then hardened, whereby the circuit board 1 electrodes 2 and the semiconductor chip 6 electrodes are connected via solder 5D formed into substantially ball shape, as shown in FIG. 8f. As the solder 5D is formed from a large volume of solder paste 5 packed successively into recesses 11 and window portions 40, deficient amounts thereof maybe avoided. The film 4 may be left adhered or arranged on the circuit board 1. Alternatively, the film 4 may be removed by dissolving it with a solvent, for example.

The embodiments set forth hereinabove are not be construed as limiting of the specific constitution of the process steps of the solder bump forming method and electronic component mounting method of the invention.

The window portions provided to the films herein need not be equal to or substantially equal in diameter to the recesses, and may be larger or smaller in diameter than the recesses.

The substrate surface layer herein may constitute the surface layer (surface) of the substrate per se. Processes for forming electrodes on the surface of a silicon substrate include a process wherein the surface of the silicon substrate is oxidized to produce a dielectric layer (silicon oxide layer) on the silicon substrate surface, the dielectric layer is etched to form recesses, and electrodes of aluminum or the like are formed within the recesses. The invention is applicable to such substrates as well.

The specific constitution of the recesses provided herein to the substrate surface layer is not limited to that in the embodiments hereinabove. Recess diameter may be designed to be smaller than electrode dimensions so that electrode surfaces are partially exposed via the recesses. Electrodes per se may be provided with recesses, as in the conventional example shown in FIG. 9a.

Laser irradiation of film adhered to a substrate surface layer may be employed herein as the method for providing the film with window portions. Various types of lasers may be used, such as excimer lasers or YAG lasers. Where laser irradiation is employed for forming window portions in a film, there is no requirement that the film be photosensitive, it being possible to use polyimide film, for example.

Specific examples of the invention are now discussed.

EXAMPLE 1

A glass fiber reinforced epoxy resin board on the surface of which a multiplicity of copper electrodes with a diameter of 50 μm had been formed on its surface at 150 μm pitch was provided on its surface with a photoresist layer having a thickness of 25 μm. The layer was then exposed and developed to form within the photoresist layer a multiplicity of recesses with a diameter of 80 μm through which the electrodes lay exposed to the outside. The photoresist layer was made of epoxy acrylate resin. An acrylic resin photosensitive film with a thickness of 50 μm was then thermocompression bonded (at 105° C., 3.5 kg/cm² pressure) over the top surface of the photoresist layer and exposed through a glass mask. The photosensitive film was then developed by etching with a 1% sodium carbonate solution to produce window portions with a diameter of 80 μm over the recesses. A solder paste containing about 50% by volume of 63% Sn-Pb solder was then packed into the window portions and recesses using a printing technique, and heated to 210° C. to melt the same. The photosensitive film was then removed using a 3% sodium hydroxide solution.

A multiplicity of solder bumps with an average height of 60 μm were formed as a result. Height variation among the multitude of solder bumps was within 2 μm. No erosion of the board was noted while the photosensitive film was being dissolved away.

EXAMPLE 2

A glass fiber reinforced epoxy resin board on the surface of which a multiplicity of copper electrodes with a diameter of 50 μm had been formed on its surface at 150 μm pitch was provided on its surface with a photoresist layer having a thickness of 25 μm. The layer was then exposed and developed to form within the photoresist layer a multiplicity of recesses having a diameter of 80 μm through which the electrodes lay exposed to the outside. The photoresist layer was made of epoxy acrylate resin. An acrylic resin photosensitive film having a thickness of 50 μm was then thermocompression bonded (at 105° C., 3.5 kg/cm² pressure) over the top surface of the photoresist layer and exposed through a glass mask. The photosensitive film was then developed by etching with a 2.3% tetramethylammonium hydroxide solution to produce window portions with a diameter of 120 um situated over the recesses. A solder paste containing about 50% by volume of 63% Sn—Pb solder was then packed into the window portions and recesses using a printing technique, and heated to 210° C. to melt the same. The photosensitive film was then removed using a 10% monoethanolamine solution.

A multiplicity of solder bumps having an average height of 75 μm were formed as a result. Height variation among the multitude of solder bumps was within 1.5 μm. No erosion of the board was noted while the photosensitive film was being dissolved away.

EXAMPLE 3

A glass fiber reinforced epoxy resin board on the surface of which a multiplicity of copper electrodes having a diameter of 50 μm had been formed at 150 μm pitch was provided on its surface with a photoresist layer with a thickness of 25 μm. The layer was then exposed and developed to form within the photoresist layer a multiplicity of recesses with a diameter of 80 μm through which the electrodes lay exposed to the outside. The photoresist layer was made of of epoxy acrylate resin. An acrylic resin photosensitive film having a thickness of 50 μm was then arranged (250° C.) over the top surface of the photoresist layer and exposed through a glass mask. The photosensitive film was then developed by etching with a 2.3% tetramethylammonium hydroxide solution to produce window portions with a diameter of 120 μm situated over the recesses. A solder paste containing about 50% by volume of 63% Sn—Pb solder was then packed into the window portions and recesses using a printing technique, and heated to 210° C. to melt the same. The photosensitive film was then removed using a 5% monoethanolamine solution.

A multiplicity of solder bumps having an average height of 75 μm were formed as a result. Height variation among the multitude of solder bumps was within 1.5 μm. No erosion of the board was noted while the photosensitive film was being dissolved away.

EXAMPLE 4

A board having formed thereon a multiplicity of 70 μm-diameter recessed Ni-surfaced electrodes at 150 μm pitch and coated with a polyimide except for the electrode portions was provided on its surface with an acrylic resin photosensitive film with a thickness of 50 μm thermocompression bonded (at 105° C., 3.5 kg/cm² pressure) thereto, which was then exposed through a glass mask. The photosensitive film was then developed by etching with a 2.3% tetramethylammonium hydroxide solution to produce window portions with a diameter of 120 μm situated over the recesses. A solder paste containing about 50% by volume of 63% Sn—Pb solder was then packed into the window portions and recesses using a printing technique, and heated to 210° C. to melt the same. The photosensitive film was then removed using a 10% monoethanolamine solution.

A multiplicity of solder bumps having an average height of 70 μm were formed as a result. Height variation among the multitude of solder bumps was within 1.5 μm. No erosion of the board was noted while the photosensitive film was being dissolved away.

EXAMPLE 5

A board on which a multiplicity of electrodes having a diameter of 70 μm and a recessed Ni surface are formed at 150 μm pitch and coated with a polyimide except for the electrode portions was provided on its surface with an acrylic resin photosensitive film with a thickness of 50 μm arranged (250° C.) thereon, which was then exposed through a glass mask. The photosensitive film was then developed by etching with a 2.3% tetramethylammonium hydroxide solution to produce window portions with a diameter of 120 μm situated over the recesses. A solder paste containing about 50% by volume of 63% Sn—Pb solder was then packed into the window portions and recesses using a printing technique, and heated to 210° C. to melt the same. The photosensitive film was then removed using a 5% monoethanolamine solution.

A multiplicity of solder bumps with an average height of 70 μm were formed as a result. Height variation among the multitude of solder bumps was within 1.5 μm. No erosion of the board was noted while the photosensitive film was being dissolved away.

EXAMPLE 6

A glass fiber reinforced epoxy resin board on which a multiplicity of copper electrodes with a diameter of 50 μm formed on its surface at 150 μm pitch was provided on its surface with a photoresist layer with a thickness of 25 μm. The layer was then exposed and developed to form within the photoresist layer a multiplicity of recesses with a diameter of 80 μm through which the electrodes lay exposed to the outside. The photoresist layer consisted of epoxy acrylate resin containing a barium sulfate filler. A polyimide film having a thickness of 50 μm thickness was then arranged over the top surface of the photoresist layer, and window portions with a diameter of 120 μm were formed over the electrodes using an excimer laser. A solder paste containing about 50% by volume of 63% Sn—Pb solder was then packed into the window portions and recesses using a printing technique, and heated to 210° C. to melt the same. The polyimide film was then removed using a 5% monoethanolamine solution.

A multiplicity of solder bumps with an average height of 75 μm were formed as a result. Height variation among the multitude of solder bumps was within 1.5 μm. No erosion of the board was noted while the photosensitive film was being dissolved away.

EXAMPLE 7

A board on which a multiplicity of electrodes having a diameter of 70 μm and a recessed Ni surface are formed at 150 μm pitch and coated with a polyimide except for the electrode portions was provided on its surface with an acrylic resin film with a thickness of 50 μm arranged thereon. Window portions having a diameter of 120 μm situated over the electrodes were then produced with a carbon dioxide laser. A solder paste containing about 50% by volume of 63% Sn—Pb solder was then packed into the window portions and recesses using a printing technique, and heated to 210° C. to melt it. The photosensitive film was then removed using a 5% monoethanolamine solution.

A multiplicity of solder bumps having an average height of 70 μm were formed as a result. Height variation among the multitude of solder bumps was within 1.5 μm. No erosion of the board was noted while the photosensitive film was being dissolved away.

EXAMPLE 8

The procedure of Example 1 was followed except for substituting solder powder (63% Sn—Pb) of 15 μm average particle size for the solder paste. Prior to filling the photosensitive film window portions and the photoresist layer recesses with solder powder, a small quantity of flux (trade name ULF-500VS ex Tamura Kaken) was applied to the inside surfaces of the window portions and recesses. Other conditions were identical to those in Example 1.

As in Example 1, a multiplicity of solder bumps having an average height of 60 μm were formed as a result. Height variation among the multitude of solder bumps was within 2 μm. No erosion of the board was noted while the photosensitive film was being dissolved away.

EXAMPLE 9

The procedure of Example 1 was followed except that, instead of packing solder paste into the photosensitive film window portions, the entire board was dipped in 210° C. molten solder (63% Sn—Pb) and then withdrawn and allowed to cool naturally to harden. Prior to dipping the entire board in molten solder, a flux was applied in the same manner as in Example 2. Other conditions were identical to those in Example 1.

A multiplicity of solder bumps with an average height of 70 μm were formed as a result. Height variation among the multitude of solder bumps was within 2 μm. No erosion of the board was noted while the photosensitive film was being dissolved away.

EXAMPLE 10

The procedure of Example 1 was followed except for replacing the 50 μm thick photosensitive film with a 40 μm thick photosensitive film of the same material. After forming a multiplicity of window portions having a diameter of 80 μm in this photosensitive film, a second 40 μm thick photosensitive film of the same material as the first photosensitive film was thermocompression bonded thereto so that the two photosensitive films were superposed. The second photosensitive film was exposed and developed in the same manner as the first photosensitive film to form a multiplicity of window portions having a diameter of 80 μm situated over the window portions in the first photosensitive film. The window portions of the two photosensitive films and the recesses in the photoresist layer were then filled with solder paste containing about 50% by volume of 63% Sn—Pb solder using a printing technique, and heated to 210° C. to melt it. The two photosensitive films were then removed using a 3% sodium hydroxide solution.

A multiplicity of solder bumps having an average height of 80 μm were formed as a result. Height variation among the multitude of solder bumps was within 2 μm. No erosion of the board was noted while the two photosensitive films were being dissolved away.

EXAMPLE 11

The procedure of Example 4 was followed except for substituting solder powder (63% Sn—Pb) of 15 μm average particle size for the solder paste. Prior to filling the window portions with solder powder, a small quantity of flux as applied to the inside surfaces of the photosensitive film window portions and photoresist layer recesses in the same manner as in Example 2. Other conditions were identical to those in Example 4.

A multiplicity of solder bumps with an average height of 80 μm were formed as a result. Height variation among the multitude of solder bumps was within 2 μm. No erosion of the board was noted while the photosensitive film was being dissolved away.

EXAMPLE 12

The procedure of Example 4 was followed except that, instead of packing solder paste into the window portions of the two photosensitive films, the entire board was dipped in 210° C. molten solder (63% Sn—Pb) and then withdrawn and allowed to cool naturally to harden. Prior to dipping the entire board in molten solder, a small quantity of flux was applied to the inside surfaces of the photosensitive film window portions and photoresist layer recesses in the same manner as in Example 5. Other conditions were identical to those in Example 4.

A multiplicity of solder bumps averaging 90 μm in height were formed as a result. Height variation among the multitude of solder bumps was within 2 μm. No erosion of the board was noted while the two photosensitive films were being dissolved away.

EXAMPLE 13

Under the same conditions as in the initial steps of Example 1, a 50 μm thick photosensitive film was thermocompression bonded over the photoresist layer of a board, a multiplicity of window portions with a diameter of 80 μm were formed in the photosensitive film, and the window portions were filled with solder paste. A semiconductor chip having a plurality of bump electrodes was then arranged on the board, and with the a plurality of bump electrodes inserted partway into the solder paste in the window portions, the solder paste was heated and melted at 210° C. and then allowed to cool naturally to harden.

Proper mechanical and electrical connection of the semiconductor chip to the board was afforded thereby.

What is claimed is:

1. A solder bump forming method comprising the steps of:
   packing solder in a plurality of recesses provided to the surface layer of a substrate; and forming bumps within said recesses by melting and hardening the solder,
   said method further having, as steps prior to said step of packing solder in said plurality of recesses, the steps of:
   adhering or arranging a film over said surface layer; and
   forming in said film a plurality of window portions communicating with said plurality of recesses;
   wherein said film is composed of a material principal component of which is different from that of the material of said substrate.

2. The solder bump forming method according to claim 1 wherein said substrate surface layer comprises a resist layer formed on the surface of the substrate, and this resist layer is exposed and developed to form openings located above said electrodes.

3. The solder bump forming method according to claim 1 wherein said film is a photosensitive film, and the step of forming said plurality of window portions in said film is a step of exposing and developing the film.

4. The solder bump forming method according to claim 1 wherein the step of forming said plurality of window portions in said film is a step of irradiating said film with a laser.

5. The solder bump forming method according to claim 1 wherein the step of packing solder in the recesses of said substrate surface layer is performed by packing solder paste through the window portions in said film.

6. The solder bump forming method according to claim 1 wherein the step of packing solder into recesses of said substrate surface layer is performed by packing solder powder through the window portions in said film.

7. The solder bump forming method according to claim 1 wherein the step of packing solder in the recesses of said substrate surface layer is performed by packing molten solder through the window portions in said film.

8. The solder bump forming method according to claim 7 wherein the step of packing solder in the recesses of said substrate surface layer is performed by immersing said substrate in a molten solder bath after forming window portions in said film.

9. The solder bump forming method according to claim 1 wherein said film is removed after solder is packed in the recesses of said substrate surface layer and is hardened.

10. An electronic component mounting method for mounting an electronic component on a substrate having a surface layer with a plurality of recesses, said substrate being formed with a plurality of electrodes each in a respective one of the recesses, the electronic component being formed with a plurality of electrodes in corresponding relationship to said plurality of recesses, said method comprising the steps of:
    adhering or arranging a film over said surface layer;
    forming in this film a plurality of window portions communicating with said plurality of recesses; and packing solder in said plurality of window portions and said plurality of recesses;

mounting the electronic component on said substrate to bring the electrodes of the electronic component into alignment with said plurality of recesses; and melting said solder for electrically connection the electrodes of the substrate to the electrodes of the electronic component.

11. An electronic component mounting method for mounting an electronic component on a substrate having a surface layer formed with a plurality of recesses, the substrate being formed with a plurality of electrodes each in a respective one of the recesses, the electronic component being formed with a plurality of solder bumps in corresponding relationship to the plurality of recesses, the method comprising the steps of:

adhering or arranging a film over the surface layer;

forming in the film a plurality of window portions communicating with the plurality of recesses; and packing solder paste or powder in the plurality of window portions and the plurality of recesses;

mounting the electronic component on the substrate to bring the solder bumps of the electronic component into alignment with the plurality of recesses; and melting the solder paste or powder together with the solder bumps of the electronic component for forming integrated solder conductors electrically connected to the electrodes of the substrate.

* * * * *